US005440327A

United States Patent [19]

Stevens

[11] Patent Number: 5,440,327

[45] Date of Patent: Aug. 8, 1995

[54] POLYCHROMATIC PEN FOR PEN PLOTTERS WITH COLOR MIXING AT MEDIA SURFACE

[75] Inventor: Wayne R. Stevens, Downey, Calif.

[73] Assignee: CalComp Inc., Anaheim, Calif.

[21] Appl. No.: 922,679

[22] Filed: Jul. 28, 1992

[51] Int. Cl.[6] .......... G01D 15/16; C23C 14/00

[52] U.S. Cl. .......... 346/46; 346/140.1; 118/50

[58] Field of Search .......... 346/46, 140 R, 140.1; 347/44; 118/50

[56] References Cited

U.S. PATENT DOCUMENTS

| | | | |
|---|---|---|---|
| 1,709,926 | 4/1929 | Weaver | 346/140 R |
| 2,556,550 | 6/1951 | Murray | 346/140 R |
| 3,281,860 | 10/1966 | Adams et al. | 346/140 R |
| 3,774,231 | 11/1973 | Tullos | 346/140 R |
| 3,900,866 | 8/1975 | Bell et al. | 346/140.1 |
| 4,361,845 | 11/1982 | Smith | 346/140 R |
| 4,524,365 | 6/1985 | Kakeno et al. | 346/140 R X |

*Primary Examiner*—Benjamin R. Fuller
*Assistant Examiner*—David Yockey
*Attorney, Agent, or Firm*—Wm F. Porter, Jr.; Robert M. Wallace

[57] ABSTRACT

The invention is a polychromatic pen cartridge for recording device such as a color plotter, or printer, for recording a color image on a recording m edium. The color image is characterized by a line width. The invention has tapered tubular lumens with plural hollow elongate lumens. The tubular lumens have a tip end facing the recording medium and spanning a distance on the recording medium on the order of the line width. Each of the lumens has an opening at the tip end and a large input opening at the other end. A plurality of separate ink reservoirs are connected to corresponding ones of the lumens at the input openings thereof. There are also valving apparatus for individually controlling ink flow from each of the ink reservoirs to a respective one of the lumens.

21 Claims, 5 Drawing Sheets

POLYCHROMATIC PEN FOR PEN PLOTTERS WITH COLOR MIXING AT MEDIA SURFACE

BACKGROUND OF THE INVENTION

This invention is a polychromatic pen cartridge for a recording device such as a color plotter or printer or the like for recording a color image on a recording medium, said color image characterized by a line width, comprising tapered lumen tubular means comprising plural hollow elongate lumen means, said tubular means having a tip end facing said recording medium and spanning a distance on said recording medium on the order of said line width, each lumen means having an opening at said tip end of said tubular means, each lumen means being characterized by a large input opening at the other end of said tubular means, a plurality of separate ink reservoirs connected to corresponding ones of said lumen means at the input openings thereof, and means for individually controlling ink flow from each of said ink reservoirs to a respective one of said lumen means.

Plotters or printers which record a graphic image on a media surface move an ink cartridge in contact with the media surface in X and Y directions over the surface of the media. Typically, the ink emitted by the cartridge is black or some other dark color, and the recorded image is a monotone image. In attempting to form a color image, two approaches may be used. One is to record in succession several monotone images of different colors on the same media surface using different cartridges containing different ink colors. Another approach would be to employ several separately activated different color pens held closely together and moved in unison relative to the media surface. The advantage of the latter approach is that it would be very fast, requiring only a single pass across the media to record a multi-colored image. The disadvantage of the latter approach is that the resolution of the recorded image would be very poor because the smallest size of a single multi-colored dot would be the combined tip areas of all of the pens. Thus, such an approach is unsatisfactory. The disadvantage of the first approach is that it is time consuming (due to the recording of a succession of images on the same media) and the alignment or registration of the plural images with each other can be problematical. Any misalignment between the successive images will create either color errors or loss of resolution or both. Where such problems are eliminated by the use of precision controls, the advantage of the first approach is that it provides a much higher resolution image than the second approach.

Yet another approach would be to inject different colored inks into the same cartridge at different positions on the media. This would provide the high resolution corresponding to the tip area of a single pen cartridge and the speed of recording all the colors of a multi-colored image in a single pass. The disadvantage of this approach, however, is that at a point of transition in the image between one distinct color and another, ink of the one color would still be flowing out of the pen tip just as ink of the other color begins to enter the input of the pen. All of the ink of the one color must be expelled through the tip before the recorded color can change. Thus, the color resolution would be very poor due to the residual amount of ink carried in the pen/tip assembly and due to the finite amount of time required to expel the residual ink when changing ink colors.

It has not seemed possible to realize the advantages of both high recording speed (i.e., single pass multi-colored image recording) and high resolution (i.e., minimum recorded image dot size equal to the tip area of a single pen cartridge) in a pen-cartridge plotter. The techniques for realizing each of these advantages do not seem to be mutually compatible.

Accordingly, it is an object of the present invention to provide a completely new approach which records multi-colored images with an ink or pen cartridge in a single pass with the resolution of a single pen cartridge.

It is another object of the present invention to provide a completely new approach which records multi-colored images with an ink or pen cartridge in a single pass with the resolution of a single pen cartridge without requiring that the ink of one color be flushed out of the pen before recording with the ink of another color.

Other objects and benefits of the invention will become apparent from the detailed description which follows hereinafter when taken in conjunction with the drawing figures which accompany it.

SUMMARY OF THE INVENTION

The foregoing objects have been achieved by the multi-color pen cartridge of the present invention for a recording device such as a color plotter or printer or the like for recording a color image on a recording medium, said color image characterized by a line width, comprising tapered lumen tubular means comprising plural hollow elongate lumen means, said tubular means having a tip end facing said recording medium and spanning a distance on said recording medium on the order of said line width, each lumen means having an opening at said tip end of said tubular means, each lumen means being characterized by a large input opening at the other end of said tubular means, a plurality of separate ink reservoirs connected to corresponding ones of said lumen means at the input openings thereof, and means for individually controlling ink flow from each of said ink reservoirs to a respective one of said lumen means. In the preferred embodiment, the tapered lumen tubular means comprises a tapered multi-lumen integral tube comprising a plurality of generally parallel elongate hollow lumens. In an alternative embodiment, the tapered lumen tubular means comprises a plurality of tapered mono-lumen tubes having their tapered tip ends gathered together within a diameter not exceeding said line width to form said tip end of said tapered lumen tubular means. In another alternative embodiment, the tapered lumen tubular means comprises an untapered multi-lumen tube whose tubular diameter does not exceed said line width, one tubular end of said multi-lumen tube facing said recording medium, and a plurality of tapered mono-lumen tubes, each comprising a tapered tip partially inserted into a corresponding one of the lumens of said multi-lumen tube at the other tubular end thereof, each of said mono-lumen tubes further comprising a larger input tip coupled to a corresponding one of said ink reservoirs. In yet another alternative embodiment, there is a rigid connector comprising plural rigid insert tubes sealingly inserted into the input openings of respective ones of said lumens of said multi-lumen tube, and means for coupling each of said insert tubes to respective ones of said separate ink reservoirs. In the preferred embodiment, one of said ink reservoirs is a waste ink reservoir, said pen cartridge further comprising vacuum pump means coupled to said waste ink reservoir whereby to remove excess ink from said recording medium through the corresponding one of said lumen means and vacuum valve means for controlling the flow of ink from said recording medium to said waste ink reservoir. The recorder device comprises a microprocessor, and wherein said means for individually controlling ink flow are coupled to said microprocessor whereby said microprocessor controls the color of ink in each portion of an image recorded on said medium. The preferred embodiment further includes reservoir empty detection means in each of said separate ink reservoirs for detecting whenever a respective ink reservoir is at least nearly empty, said detection means connected to said microprocessor, whereby said microprocessor may automatically halt recording operation by said recording device whenever any one of said ink reservoirs is at least nearly empty. The preferred embodiment further comprises rigid nib means surrounding said tip end of said tapered lumen tubular means, said nib means defining a closed volume within which ink from said lumen means may spread on the surface of said medium, said nib means having a diameter equal to said line width. In an alternative embodiment, the tapered lumen tubular means comprises a rigid material and wherein said tip means spans a distance across said medium equal to said line width.

DETAILED DESCRIPTION OF THE INVENTION

Figures 1, 2, 3:
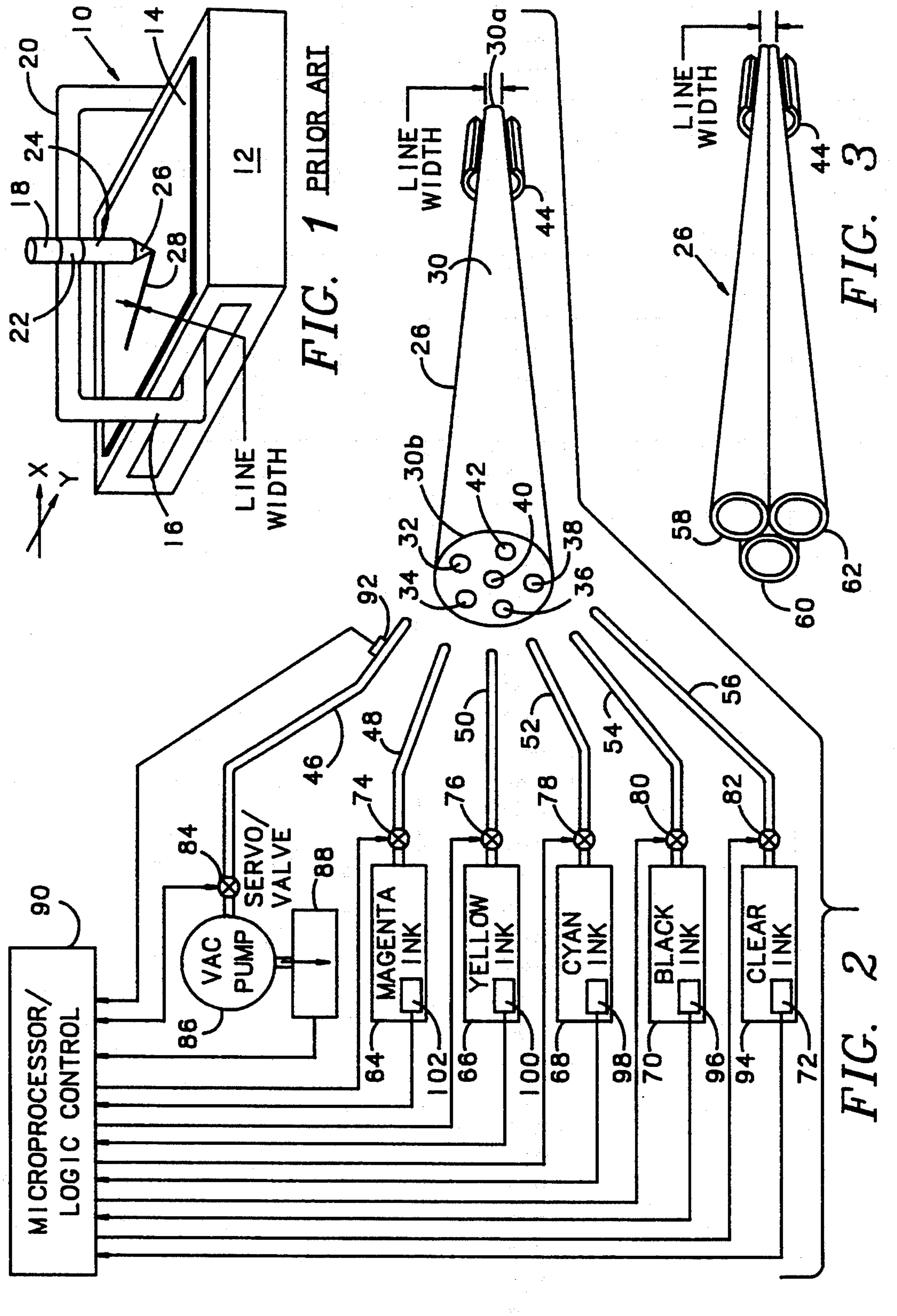
FIG. 1 is a simplified perspective view of a pen cartridge plotter of a type well-known in the art.
FIG. 2 is a simplified diagram of a multi-color pen cartridge embodying the present invention and which is to be used in the plotter of FIG. 1.
FIG. 3 is a perspective view of three individual tapered ink tubes held together at the cartridge tip in accordance with an alternative embodiment of the present invention.

Referring to FIG. 1, a pen cartridge plotter 10 includes a base 12 supporting an image recording medium 14 (such as a sheet of paper or bristol board). The base 12 has a chassis containing servo control devices (not shown) governing the longitudinal (Y-axis) motion of a cartridge-supporting carriage 16. A pen cartridge 18 is supported on a top horizontal arm 20 of the carriage 16 by a belt 22. The carriage 16 has servo devices in its horizontal top spar 20 governing the transverse (X-axis) motion of the pen cartridge 18.

The cartridge 18 has a cylindrical ink reservoir section 24 and a pointed conical tip 26 which absorbs the ink from the reservoir 24 and applies it onto the media 14. For example, if the cartridge 18 is transported along the X and Y axes simultaneously, the ink from the tip 26 paints a diagonal line 28 on the media 14.

It can be readily appreciated that if one were to attempt to record multi-colored images on the media 14 by employing separately activated reservoirs with different colors of ink in the reservoir section 24, each change in color would require that the old color ink be completely flushed from the tip 26 before the new color could be recorded. The time required to do this at each boundary in the recorded image between different colors and the amount of residual ink contained in the tip 26 (which must be flushed out at that point) would significantly reduce the image quality.

This problem is solved in the present invention illustrated conceptually in the simplified block diagram of FIG. 2. In the invention, the interior of the pen cartridge tip 26 is as shown in FIG. 2 and comprises a multi-lumen tapered cylindrical tube 30 having plural parallel lumens 32, 34, 36, 38, 40, 42. Each of these lumens is a hollow tapered cylindrical chamber whose cylindrical axis is generally parallel to the cylindrical axis of the multi-lumen tube 30. The pointed end 30 of the tapered tube 30 is surrounded by a cylindrical metal sheath 44 whose diameter is approximately the line width of the recorded line 28 on the media 14 of FIG. 1. In the typical case, the line width (and therefore the diameter of the tapered tube) is on the order of 0.01 inch.

Different colors of ink are controllably injected into different ones of plural cylindrical mono-lumen tubes 46, 48, 50, 52, 54, 56 connected to respective ones of the hollow lumens 32, 34, 36, 38, 40, 42. Each of the mono-lumen tubes 46–56 is much larger in diameter than the line width (for ease of assembly and connection) and is dedicated to supplying a corresponding one of the lumens 32–42 in the multi-lumen tube 30 with a particular color of ink. For this purpose, in the preferred embodiment each of the mono-lumen tubes 46–56 is to be partially inserted at the large end **30*b* of the multi-lumen tube 30 into a corresponding one of the hollow lumens 32–42. Thus, as the cartridge tip 26 begins to contact an area on the media 14 which is to be colored yellow, yellow ink is immediately caused to flow through that one of the mono-lumen tubes 46–56** which is dedicated to yellow ink.

Tapered multi-lumen tubes such as the multi-lumen tube 30 of FIG. 2 are well-known, particularly in the medical arts, and are typically made by extruding plastic tubing, such as polyurethane or an elastomer. For this application similar materials such as polypropylene or polystyrene are used since they may be stretched easily to small diameters. The tubing is heated and one or both ends are pulled so as to stretch the tube, causing its diameter to shrink to a taper whose apex is centered between the points at which the tubing is pulled. The angle of the taper can be determined by the rate at which the tubing is pulled, as is well-known. A well-known example of such multi-lumen tubing is medical grade polyurethane multi-lumen tubing formed of a polyurethane material sold under the registered trademark "TECOFLEX" by Thermetics Inc. of Woburn, Mass.

According to one aspect of the invention, the tube 30 may be formed of a very hard material instead of the foregoing relatively soft plastic materials. In such a case, the rigid nib or metal sheath 44 would be eliminated and the recorded line width would be the diameter of the multi-lumen tube 30. This would provide a much finer line width. Glass is a suitable material since it is hard, may be stretched to a small diameter when heated, and glass fibers have good mechanical strength. In particular, soda lime glass and boro-silicates such as those sold under the tradename PYREX would be suitable materials. Preferably, the outside of a glass tube should be coated with a plastic film to preserve the mechanical strength of the glass.

In the alternative embodiment of FIG. 3, rather than employing a single multi-lumen tube, several tapered mono-lumen tubes 58, 60, 62 are held together at their tapered ends in the nib 44 to form the cartridge tip 26.

The system of FIG. 2 includes five uniformly pressurized ink reservoirs 64, 66, 68, 70, 72 connected to respective ones of the mono-lumen tubes 48–56 and five electronically actuated valves 74, 76, 78, 80, 82 controlling the ink flow from respective ones of the reservoirs 64–72 to corresponding ones of the mono-lumen tubes 48–56. A vacuum pump 86 creates a vacuum in the mono-lumen tube 46 through an electronically actuated valve 84 to draw excess ink from the media 14 through one of the individual lumens in the tube 30 connected to the tube 46 into a waste ink reservoir 88. A microprocessor 90 controls each of the valves 74–84 and senses the vacuum pressure in tube 46 through a sensor 92. Detectors 94–102 in the ink reservoirs 64–72 signal the microprocessor 90 whenever a corresponding one of the reservoirs is nearly empty, so that the microprocessor 90 can halt the recording operation just before the ink runs out and generate a "reservoir empty" alarm. The microprocessor 90 individually actuates each of the valves 74–82 depending upon the position of the tip 26 on the media 14 and depending upon the desired color to be recorded at that position. By maintaining a closed pressure system (in which no ink flows to the media through the open end of any of the lumens 32–42 when the corresponding valve is closed), the microprocessor 90 precisely controls the recorded color by electronically actuating the valves 74–82. By modulating the valve 84 in response to the pressure detected at the sensor 92, the microprocessor 90 provides closed-loop regulation of the vacuum with which excess ink is removed from the media 14 into the waste reservoir 88.

Figures 4, 5, 6, 7, 8:
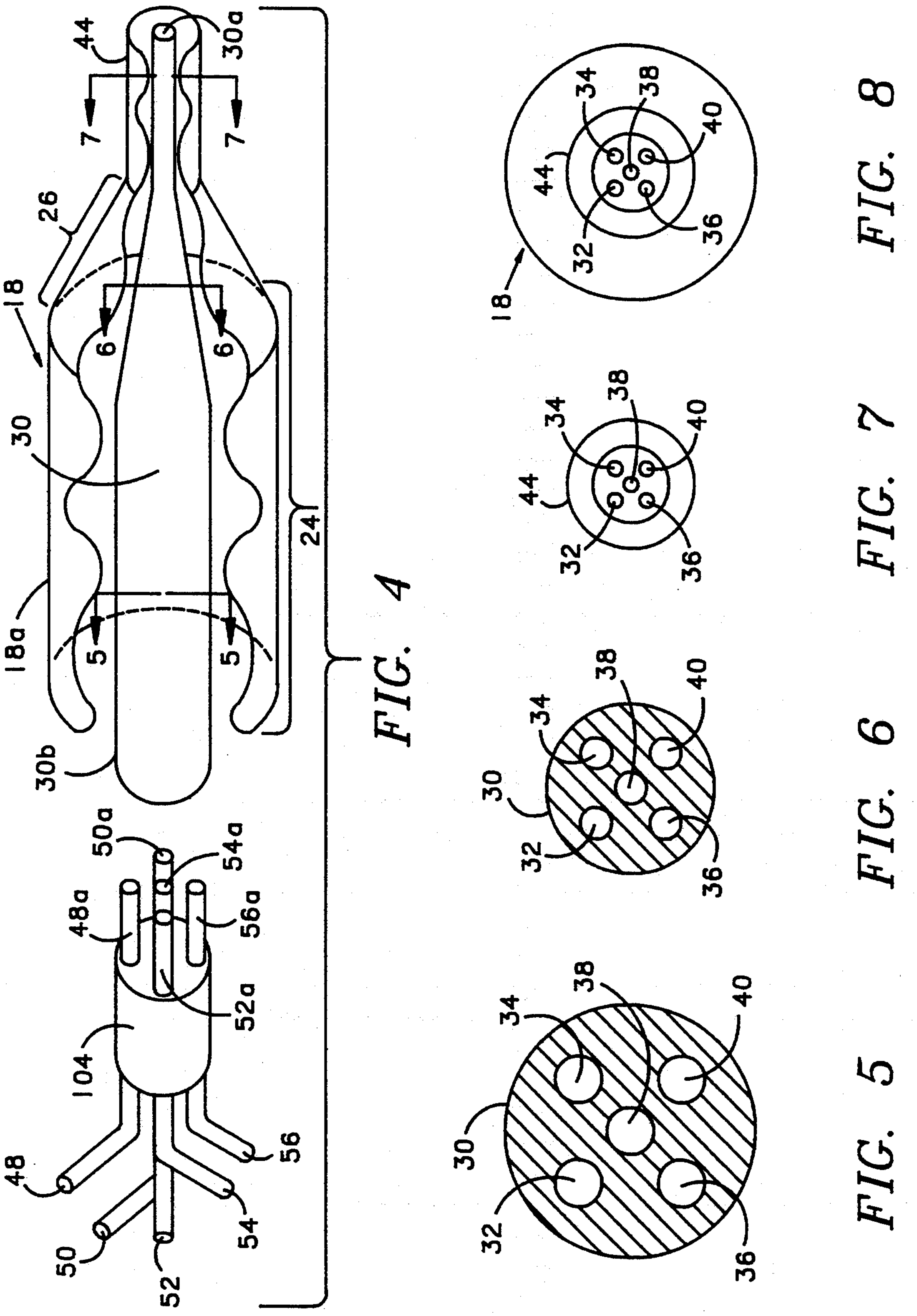
FIG. 4 is a partially cut-away view of a preferred embodiment of a multi-colored pen cartridge of the invention.
FIGS. 5, 6 and 7 are respective cross-sectional views of the cartridge of FIG. 4.
FIG. 8 is an end view of the cartridge of FIG. 4.

FIG. 4 illustrates a preferred embodiment of the cartridge 18 in which the cartridge housing **18*a* is partially cut-away to reveal the tapered multi-lumen tube 30. In the embodiment of FIG. 4, there are five hollow lumens in the tube 30. The progression of the tapered cross-section of the tube 30 is illustrated in successive cross-sectional views in FIGS. 5, 6 and 7 while an end view of the tip end 30*a* is illustrated in FIG. 8**.

In the embodiment of FIG. 4, a rigid connecter 104 has five hard tubular inserts **48*a*, 50*a*, 52*a*, 54*a*, 56*a* individually inserted into the mono-lumen tubes 48–54 at the large end 30*b* of the tube 30. The hard inserts fit snugly inside respective ones of the hollow lumens 32–40 of the multi-lumen tube 30**.

Figure 10:
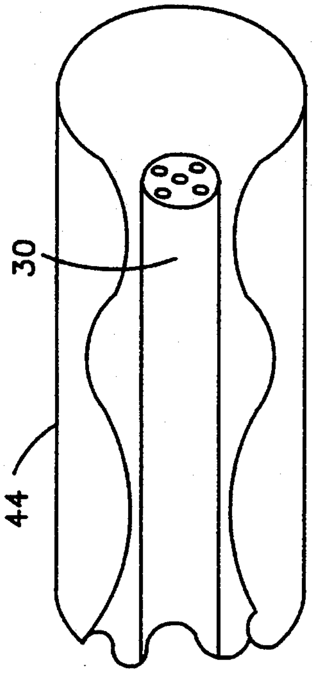
FIGS. 9, 10 and 11 are partially cut-away views of different embodiments of the nib and tip of the pen cartridge of the invention with FIG. 9 being the preferred embodiment.
Figure 9:
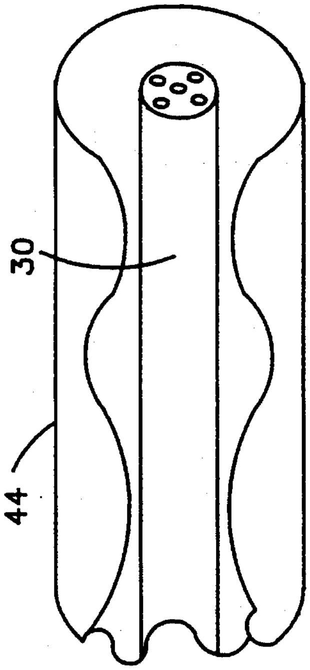
Figure 11:
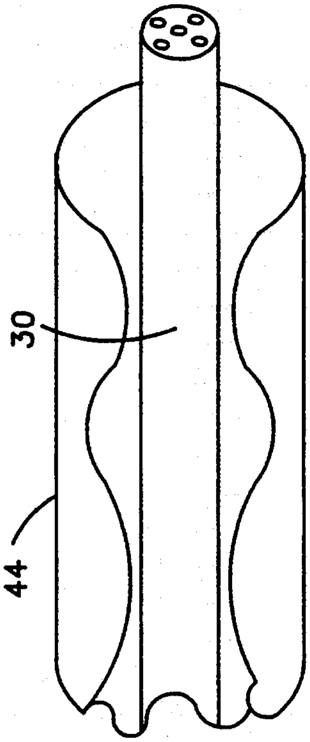
Figure 19:
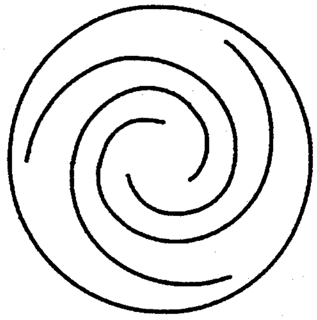
FIGS. 19 through 25 are end views corresponding to the end view of FIG. 8 illustrating alternative embodiments of multiple concentric spiral openings in the pen tip of the present invention.
Figure 20:
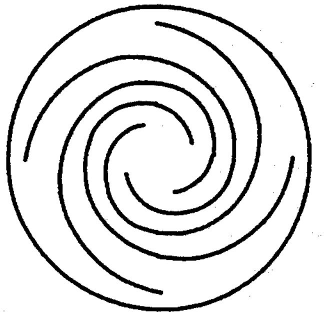
Figure 21:
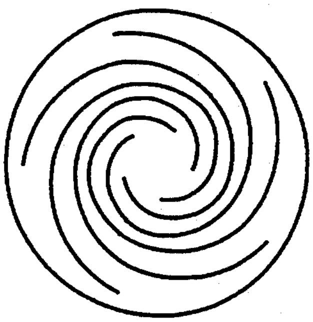
Figure 22:
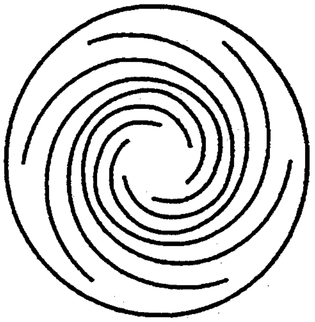

FIGS. 4 and 9 illustrate the preferred embodiment of the invention in which the tapered tip end **30*a* of the multi-lumen tube 30 is flush with the end of the nib 44. FIG. 10 illustrates an alternative embodiment in which the tube end 30*a* is recessed within the nib 44 to provide better mixing of different colored inks at the surface of media. However, it should be understood that such mixing of the different colored inks at the media surface is also accomplished in the preferred embodiment of FIG. 9. FIG. 11 illustrates how the multi-lumen tube 30 may protrude out of the nib 44 if the tube is made of a very hard material, as mentioned previously herein. This permits the line width to be reduced to the diameter of the tube 30**.

Figure 13:
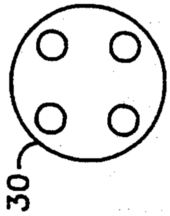
FIGS. 12 through 18 are end views corresponding to the end view of FIG. 8 of different embodiments of the present invention.
Figure 12:
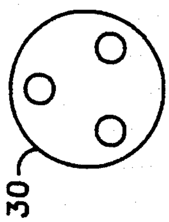
Figure 18:
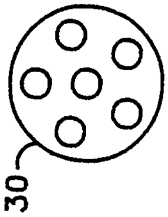
Figure 17:
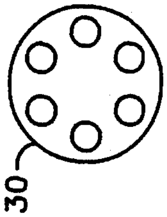
Figure 16:
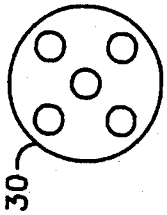
Figure 15:
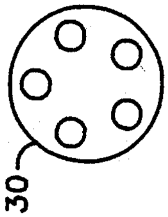
Figure 14:
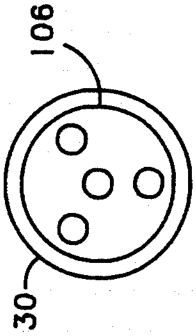

FIG. 12 illustrates a multi-lumen tube for recording 3 colors. The lumen axes are placed at the points of an isosceles triangle. FIGS. 13 and 14 illustrate alternative ways of locating four lumens in a multi-lumen tube for recording three colors and sucking away excess ink with the fourth lumen or for recording four colors with no sucking. FIGS. 15 and 16 illustrate alternative arrangements of five lumens in a multi-lumen tube while FIGS. 17 and 18 illustrate alternative arrangements of six lumens in a multi-lumen tube. In each case, one of the lumens may be dedicated to the suction function or else all of the lumens may be dedicated to carrying ink. In each case, one of the ink colors may be "clear" to permit selective dilution of another ink color deposited simultaneously on the media with the clear ink, to achieve gray scale control. This permits the microprocessor 90 to respond to a command to vary the intensity of a color being recorded. For good image quality, it is preferable that the lumens in the multi-lumen tube be grouped very closely together at the tip end of the tube in a small circle 106 (see FIG. 14) and that the radius of the multi-lumen tube be greater than the radius of the circle 106 encompassing the lumens, perhaps by as much as a factor of two, for example.

Figure 23:
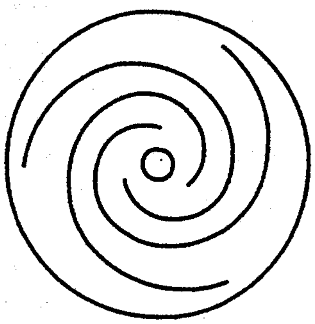
Figure 24:
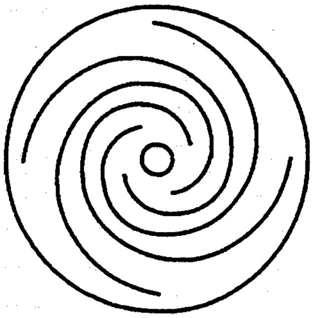
Figure 25:
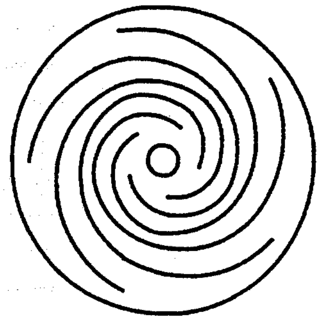

FIGS. 19–22 show how the lumens may be formed as concentric spirals in the multi-lumen tube for better image control. FIGS. 23–25 show how a central lumen may be located for better vacuum control.

Figure 26:
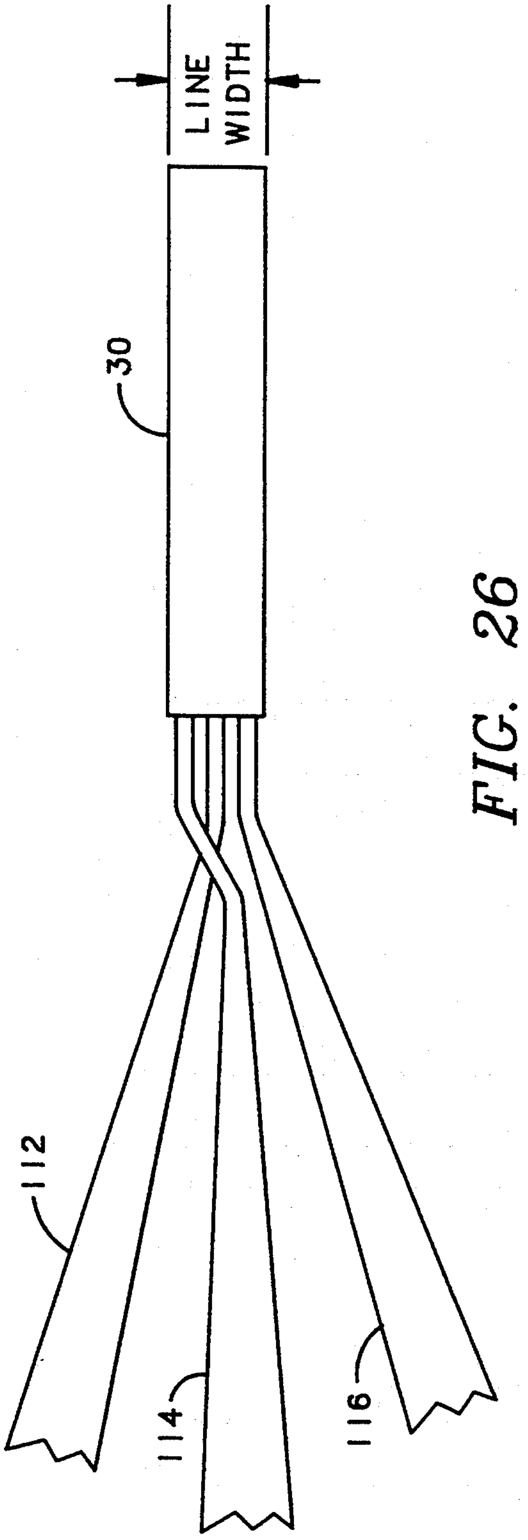
FIG. 26 is a side view of an alternative embodiment of the present invention employing plural tapered mono-lumen tubes.
Figure 27:
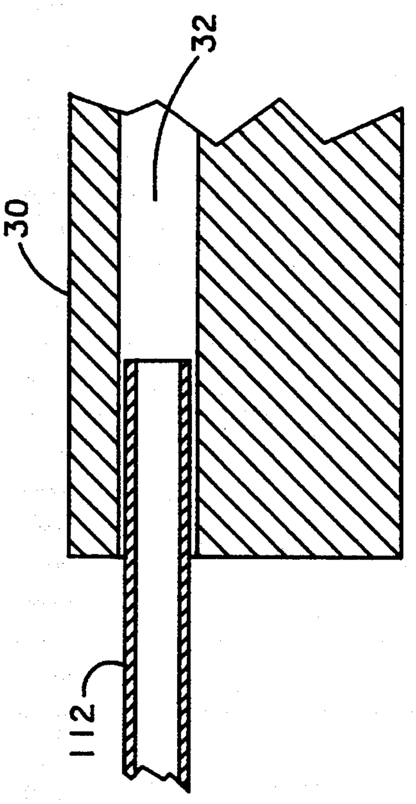
FIG. 27 is a partially cut-away cross-sectional view of a portion of the embodiment of FIG. 26.

FIG. 26 illustrates another alternative embodiment in which the multi-lumen tube is an untapered cylinder whose radius may, for example, be equal to the line width. Ink is brought into each lumen by individual tapered mono-lumen tubes 112, 114, 116, whose small tapered ends fit snugly into the respective lumens, as illustrated in FIG. 27.

Wherefore, having thus described the invention, what is claimed is:

1. A multi-color pen cartridge for recording a color image on a recording medium in a recorder device, said color image characterized by a line width, said pen cartridge comprising:

a) tapered lumen tubular means for supporting ink flow comprising plural elongate lumens, said tapered lumen tubular means having a tip end and an opposite end, said tip end facing said recording medium and spanning a distance on said recording medium on an order of said line width, each one of said lumens having an opening at said tip end of said tapered lumen tubular means, each one of said lumens further having an input opening at said opposite end of said tapered lumen tubular means which is larger than the opening at said tip end;

b) a waste ink reservoir coupled to one of said lumens at the input opening thereof;

c) vacuum pump means coupled to said waste ink reservoir for removing excess ink from said recording medium through the one of said lumens coupled to said waste ink reservoir;

d) vacuum valve means for controlling ink flow from said recording medium to said waste ink reservoir.

e) a plurality of ink reservoirs, wherein remaining ones of said lumens are each coupled to one of said plurality of ink reservoirs at the input opening; and, f) means for individually controlling ink flow from each one of said ink reservoirs to the one of said lumens connected thereto.

2. The pen cartridge of claim 1 wherein said tapered lumen tubular means comprises:

a tapered multi-lumen integral tube in which the plural elongate lumens are disposed generally parallel to each other.

3. The pen cartridge of claim 2 and further comprising a connector comprising:

a) plural insert tubes having a first end and a second end, wherein the first end of each of the plural insert tubes is sealingly inserted into the input opening of one of said plural elongate lumens of said tapered multi-lumen integral tube; and, b) means for coupling the second end of each plural insert tube to one of said ink reservoirs.

4. The pen cartridge of claim 1 wherein:

said plural elongate lumens have tapered tip ends gathered together within a diameter not exceeding said line width to form said tip end of said tapered lumen tubular means.

5. The pen cartridge of claim 1 wherein said tapered lumen tubular means comprises:

a) an untapered multi-lumen tube having a first tubular end and a second tubular end, in which the plural elongate lumens are disposed generally parallel to each other, having a tubular diameter that does not exceed said line width, the first tubular end of said multi-lumen tube facing said recording medium; and, b) a plurality of tapered mono-lumen tubes, each one of said plurality of tapered mono-lumen tubes comprising a tapered tip partially inserted into a corresponding one of the plural elongate lumens of said multi-lumen tube at the second tubular end of said multi-lumen tube, each one of said mono-lumen tubes further comprising an input tip coupled to a corresponding one of said ink reservoirs.

6. The pen cartridge of claim 1 wherein:

a) said recorder device comprises a microprocessor; and wherein additionally, b) said means for individually controlling ink flow from each one of said ink reservoirs is coupled to said microprocessor whereby said microprocessor controls the color of ink in each portion of an image recorded on said medium.

7. The pen cartridge of claim 6 and further comprising:

reservoir empty detection means in each one of said ink reservoirs for detecting whenever any one of said ink reservoirs is at least nearly empty, said detection means being connected to said microprocessor, whereby said microprocessor automatically halts recording operation by said recording device whenever any one of said ink reservoirs is at least nearly empty.

8. The pen cartridge of claim 1 and further comprising:

a nib surrounding said tip end of said tapered lumen tubular means, said nib defining a closed volume within which ink from said lumens spreads on the surface of said medium, said nib having a diameter equal to said line width.

9. The pen cartridge of claim 8 wherein:

said tip end is recessed within said nib.

10. The pen cartridge of claim 1 wherein:

a) said tapered lumen tubular means comprises a rigid material; and, b) said tip end spans a distance across said medium equal to said line width.

11. The pen cartridge of claim 1 wherein:

said tip end of said tapered lumen tubular means has a circular cross-section, and said opening of each of said plural elongate lumens at said tip end of said tapered lumen tubular means are confined within an inner diameter smaller than a diameter of said circular cross-section of said tip end.

12. The pen cartridge of claim 11 wherein:

said inner diameter is on an order of one half said diameter of said tip end.

13. The pen cartridge of claim 1 wherein:

said lumens comprise individual cylinders having axes at said tip end that are generally perpendicular to a plane of said recording medium.

14. The pen cartridge of claim 1 wherein:

lumens have concentric spiral cross-sections at said tip end.

15. A multi-color pen for recording lines characterized by a certain line width on a recording medium, said pen comprising:

a) a plurality of different color ink supply means for supplying ink;

b) a waste ink reservoir;

c) tapered tubular means for supporting ink flow comprising a plurality of elongate ink flow passages, an ink output tip end having a diameter not greater than said line width and an ink input end having a diameter larger than said ink output tip end, said passages having smaller openings in said ink output tip end than said openings at said ink input end, wherein said smaller openings in said ink output tip end all fit within the diameter of said tip end and wherein each one of said openings at said ink input end is coupled to a respective one of said plurality of different color ink supply means and to said waste ink reservoir; and, d) vacuum pump means coupled to said waste ink reservoir for removing excess ink from said recording medium through one of said ink flow passages coupled to said waste ink reservoir.

16. The multi-color pen of claim 15 and further comprising:

means for controlling ink flow from each one of said plurality of different color ink supply means to a respective one of said ink flow passages connected thereto.

17. The multi-color pen 15 and further comprising:

vacuum value means for controlling the removing of excess ink from said recording medium to said waste ink reservoir.

18. A multiple ink writing instrument for recording lines characterized by a line width on an ink recording medium, said writing instrument comprising:

a) a plurality of separate ink supply means for supplying ink;

b) a waste ink reservoir;

c) multi-passage ink transport means for supporting ink flow to said medium and removing ink from said medium comprising a means for supporting ink flow from said plurality of separate ink supply means towards said ink recording medium and a means for removing ink from said ink recording medium to said waste ink reservoir, said means for supporting ink flow from said plurality of separate ink supply means towards said ink recording medium comprising, c1) plural ink input openings for receiving ink from said plurality of ink supply means, each one of said ink input openings comprising an opening larger than said line width to accommodate connection to said ink supply means, c2) plural ink output openings for disbursing onto said medium ink received at respective ones of said plural ink input openings, ones of said plural ink output openings being separately coupled to respective ones of said plural ink input openings, said plural ink output openings being smaller than said line width and arranged in an array spanning a distance across the surface of said medium no greater than said line width, and said means for removing ink from said ink recording medium comprising, c3) a waste ink input opening for receiving waste ink disbursed onto said medium, and, c4) a waste ink output opening coupled to said waste ink input opening and said waste ink reservoir for removing waste ink to said waste ink reservoir; and, d) vacuum pump means coupled to said waste ink reservoir for removing excess ink from said recording medium through said multi-passage ink transport means.

19. The multiple ink writing instrument of claim 18 wherein said multi-passage ink transport means comprises:

a tapered multi-lumen tube.

20. The multiple ink writing instrument of claim 18 wherein said multi-passage ink transport means comprises:

a plurality of tapered mono-lumen tubes.

21. The multiple ink writing instrument of claim 18 further comprising:

a) means for individually controlling ink flow from each one of said separate ink supply means to a corresponding one of said plural ink input openings; and, b) vacuum valve means for controlling the removing of ink away from said ink recording medium to said waste ink reservoir.

* * * * *